US009785170B2

(12) United States Patent
Kim

(10) Patent No.: US 9,785,170 B2
(45) Date of Patent: Oct. 10, 2017

(54) DISPATCHER TRAINING SIMULATING DEVICE AND OPERATION METHOD THEREOF

(71) Applicant: LSIS CO., LTD., Anyang-si, Gyeonggi-do (KR)

(72) Inventor: Tae Kwon Kim, Uiwang-si (KR)

(73) Assignee: LSIS CO., LTD., Anyang-si (KR)

( * ) Notice: Subject to any disclaimer, the term of this patent is extended or adjusted under 35 U.S.C. 154(b) by 344 days.

(21) Appl. No.: 14/557,332

(22) Filed: Dec. 1, 2014

(65) Prior Publication Data

US 2015/0177766 A1 Jun. 25, 2015

(30) Foreign Application Priority Data

Dec. 19, 2013 (KR) .................. 10-2013-0159525

(51) Int. Cl.
*G06F 19/00* (2011.01)
*G05F 1/66* (2006.01)
(Continued)

(52) U.S. Cl.
CPC ............ *G05F 1/66* (2013.01); *G06F 17/5009* (2013.01); *G06N 99/005* (2013.01); *G09B 25/02* (2013.01);
(Continued)

(58) Field of Classification Search
CPC ....... G05F 1/66; G06F 17/5009; G09B 25/02; G06N 99/005; Y04S 40/22; H02J 3/06; H02J 2003/007
See application file for complete search history.

(56) References Cited

U.S. PATENT DOCUMENTS 5,625,751 A * 4/1997 Brandwajn ............... H02J 3/24
706/20
8,972,066 B2 * 3/2015 Anderson .............. G01D 4/004
340/870.02
(Continued)

FOREIGN PATENT DOCUMENTS

CN 102509018 6/2012
CN 102684188 9/2012
(Continued)

OTHER PUBLICATIONS

Katiraei, Farid, et al. "Microgrids management." IEEE Power and Energy Magazine 6.3 (2008): 54-65.*
(Continued)

*Primary Examiner* — Michael D Masinick
(74) *Attorney, Agent, or Firm* — Lee, Hong, Degerman, Kang & Waimey PC

(57) ABSTRACT

A dispatcher training simulating device includes an energy management system (EMS) actual measurement data loader configured to load EMS actual measurement data to the dispatcher training simulating device, an EMS actual measurement data initializing unit configured to calculate a power flow by adjusting a generator output in the loaded EMS actual measurement data, and generate initialized EMS actual measurement data based on whether the calculated power flow converges on a predetermined value, and a dispatcher training simulation providing unit configured to provide a dispatcher training simulation based on the initialized EMS actual measurement data.

11 Claims, 2 Drawing Sheets

(51) Int. Cl.
*G06N 99/00* (2010.01)
*G06F 17/50* (2006.01)
*G09B 25/02* (2006.01)
*H02J 3/00* (2006.01)
*H02J 3/06* (2006.01)

(52) U.S. Cl.
CPC ............ *H02J 3/06* (2013.01); *H02J 2003/007* (2013.01); *Y02E 60/76* (2013.01); *Y04S 40/22* (2013.01)

(56) References Cited

U.S. PATENT DOCUMENTS

| | | | | |
|---|---|---|---|---|
| 9,075,591 | B2* | 7/2015 | Cho | .................... H04L 67/1095 |
| 2011/0172835 | A1 | 7/2011 | Imes | |
| 2011/0175750 | A1* | 7/2011 | Anderson | .............. G01D 4/004 |
| | | | | 340/870.16 |
| 2014/0337655 | A1* | 11/2014 | Cho | ................... H04L 67/1095 |
| | | | | 713/340 |
| 2015/0074061 | A1* | 3/2015 | Yoon | ................. G06F 17/30091 |
| | | | | 707/654 |
| 2015/0134135 | A1* | 5/2015 | Wong | ........................ H02J 3/38 |
| | | | | 700/295 |
| 2015/0153716 | A1* | 6/2015 | Anderson | .............. G01D 4/004 |
| | | | | 700/286 |

FOREIGN PATENT DOCUMENTS

| | | |
|---|---|---|
| CN | 102684207 | 9/2012 |
| KR | 10-1482459 | 1/2015 |

OTHER PUBLICATIONS

Maghsoodlou, Faramarz, Ralph Masiello, and Terry Ray. "Energy management systems." IEEE Power and Energy Magazine 2.5 (2004): 49-57.*
Wollenberg, Bruce F., and Toshiaki Sakaguchi. "Artificial intelligence in power system operations." Proceedings of the IEEE 75.12 (1987): 1678-1685.*
Fan, Jiyuan, and Stuart Borlase. "The evolution of distribution." IEEE Power and Energy Magazine 7.2 (2009): 63-68.*
"Use of Artificial Neural Networks in a Dispatcher Training Simulator for Power System Dynamic Security Assessment", Aggoune et al, Florida International University, IEEE 1990.*
Waight, et al., "An Advanced Transportable Operator Training Simulator," Proceedings of the Power Industry Computer Application Conference, XP010038519, May 1991, 7 pages.
Monticelli, "Electric Power System State Estimation," Proceedings of the IEEE, vol. 88, No. 2, XP011450697, Feb. 2000, 21 pages.
European Patent Office Application Serial No. 14197172.1, Search Report dated Apr. 22, 2015, 7 pages.
State Intellectual Property Office of the People's Republic of China Application Serial No. 201410795903.3, Office Action dated Jun. 28, 2017, 6 pages.

\* cited by examiner

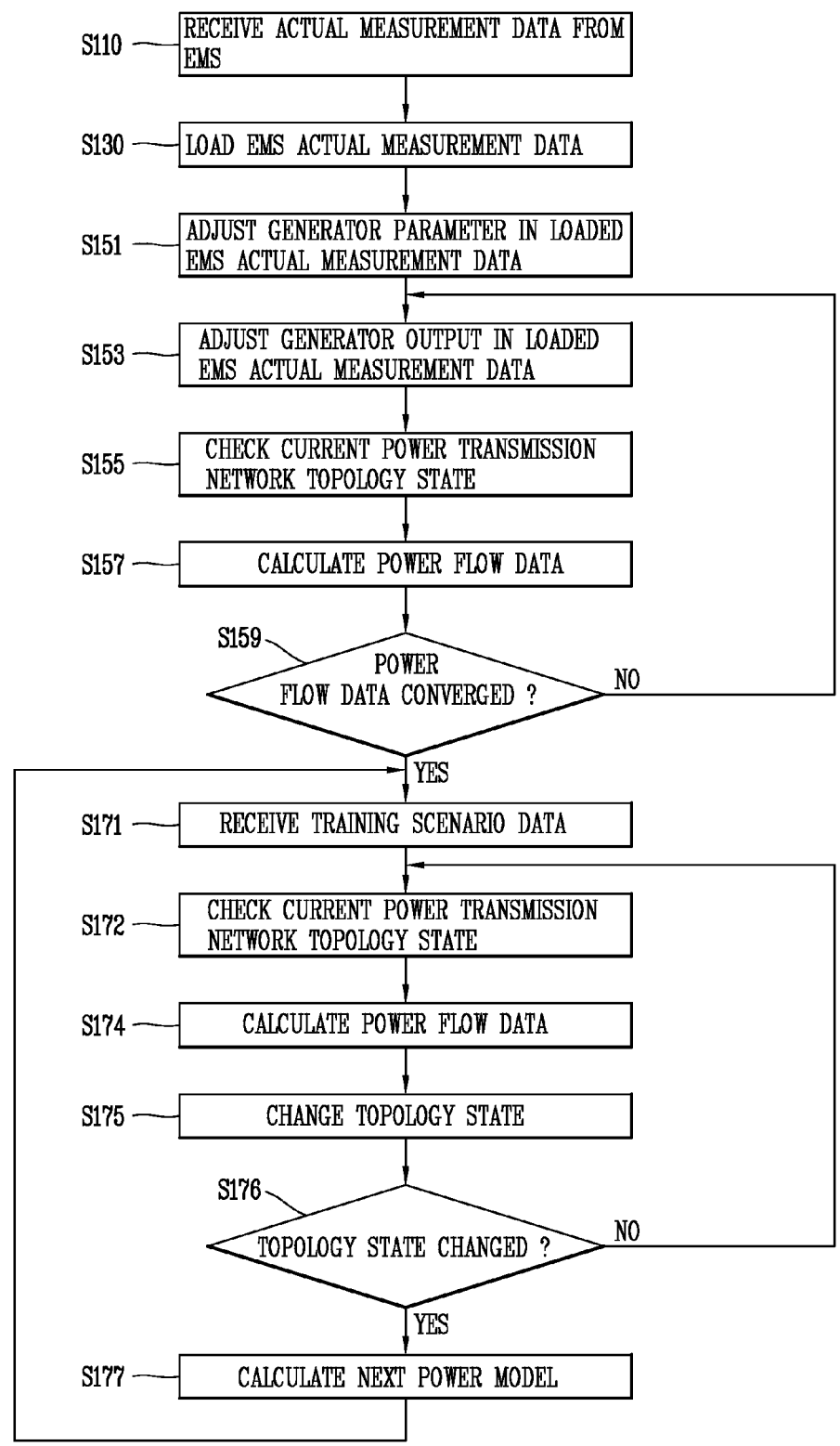

DISPATCHER TRAINING SIMULATING DEVICE AND OPERATION METHOD THEREOF

CROSS-REFERENCE TO RELATED APPLICATION

Pursuant to 35 U.S.C. §119(a), this application claims the benefit of earlier filing date and right of priority to Korean Application No. 10-2013-0159525, filed on Dec. 19, 2013, the contents of which is incorporated by reference herein in its entirety.

BACKGROUND OF THE INVENTION

1. Field of the Invention

The present disclosure relates to a dispatcher training simulating device and an operation method thereof.

2. Background of the Invention

In line with a rapid increase in power demand, power transmission facilities have continuously expanded and, due to complicated connections of a transmission grid and topology diversification within a substation, complexity of electric power system operation work has been intensified. Also, demand for stable power supply has increased, and the possibility of generating an unstable accident in an electric power system such as collapse of voltage, generator rejection, and the like, is on the increase due to complexity of an electric power system and an increase in demand for power. In this context, if a manipulation error of an energy management system (EMS) dispatcher occurs, an accident may spread and a considerably large scale of social loss may be made due to disruptive power supply. Thus, in order to ensure a stable operation of an electric power system, a dispatcher needs to be systematically trained, repeated training is required for a normal operation, in preparation for the occurrence of an accident, recovery manipulation, and the like.

A dispatcher training simulator (DTS), basically developed to train an EMS dispatcher, provides an operational function and a screen identical to those of an EMS and a function to simulate an electric power system.

A DTS stores data, which was actually measured in an EMS system and stored in a database, as a file and uses it, and in this case, the actually measured data has a great amount of errors due to errors of a communication network and a communication obtaining device. In fact, 70% of the stored file is not available to be used in a simulator due to errors.

SUMMARY OF THE INVENTION

Therefore, an aspect of the detailed description is to provide a dispatcher training simulating device and an operation method thereof capable of increasing a usage rate of actually measured EMS data by correcting actually measured error data.

To achieve these and other advantages and in accordance with the purpose of this specification, as embodied and broadly described herein, a dispatcher training simulating device includes: an energy management system (EMS) actual measurement data loader configured to load EMS actual measurement data to the dispatcher training simulating device; an EMS actual measurement data initializing unit configured to calculate a power flow by adjusting a generator output in the loaded EMS actual measurement data, and generate initialized EMS actual measurement data based on whether the calculated power flow converges on a predetermined value; and a dispatcher training simulation providing unit configured to provide a dispatcher training simulation based on the initialized EMS actual measurement data.

The EMS actual measurement data initializing unit may include: a generator output adjusting unit configured to adjust the generator output to correct the loaded EMS actual measurement data; a topology processing unit configured to analyze the corrected EMS actual measurement data to check the current power transmission network topology state; a power flow calculating unit configured to calculate power flow data based on the current power transmission network topology state and the adjusted generator output; and a power flow data checking unit configured to generate corrected EMS actual measurement data corresponding to converged power flow data, as the initialized EMS actual measurement data.

The EMS actual measurement data initializing unit may further include: a generator parameter adjusting unit configured to adjust a generator parameter in the loaded EMS actual measurement data to correct the loaded EMS actual measurement data.

The generator parameter may include an upper limit value and a lower limit value of the generator output.

The generator output adjusting unit may adjust the generator output in consideration of a load value and power loss.

The power flow calculating unit may calculate power flow data based on the current power transmission network topology state, the adjusted generator output, and the load value.

The dispatcher training simulation providing unit may include: a scenario processing unit configured to receive training scenario data from an operator; a topology processing unit configured to analyze the initialized EMS actual measurement data to check the current power transmission network topology state; a power flow calculating unit configured to calculate power flow data based on the training scenario data, the current power transmission network topology state, the generator output, and the load value; and a power model calculating unit configured to calculate a next power model based on the power flow data.

The dispatcher training simulating device may further include: a topology state changing unit configured to change the power transmission network topology state based on the power flow data.

When the topology state is not changed, the power model calculating unit may calculate a next power model based on the power flow data.

The dispatcher training simulating device according to an embodiment of the present disclosure can increase a usage rate of EMS actual measurement data by correcting actually measured error data. In particular, the dispatcher training simulating device according to an embodiment of the present disclosure can increase a usage rate of EMS actual measurement data up to 80% or greater.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 2 is a flow chart illustrating an operation of the dispatcher training simulating device according to an embodiment of the present invention.

DETAILED DESCRIPTION OF THE INVENTION

Figure 1:
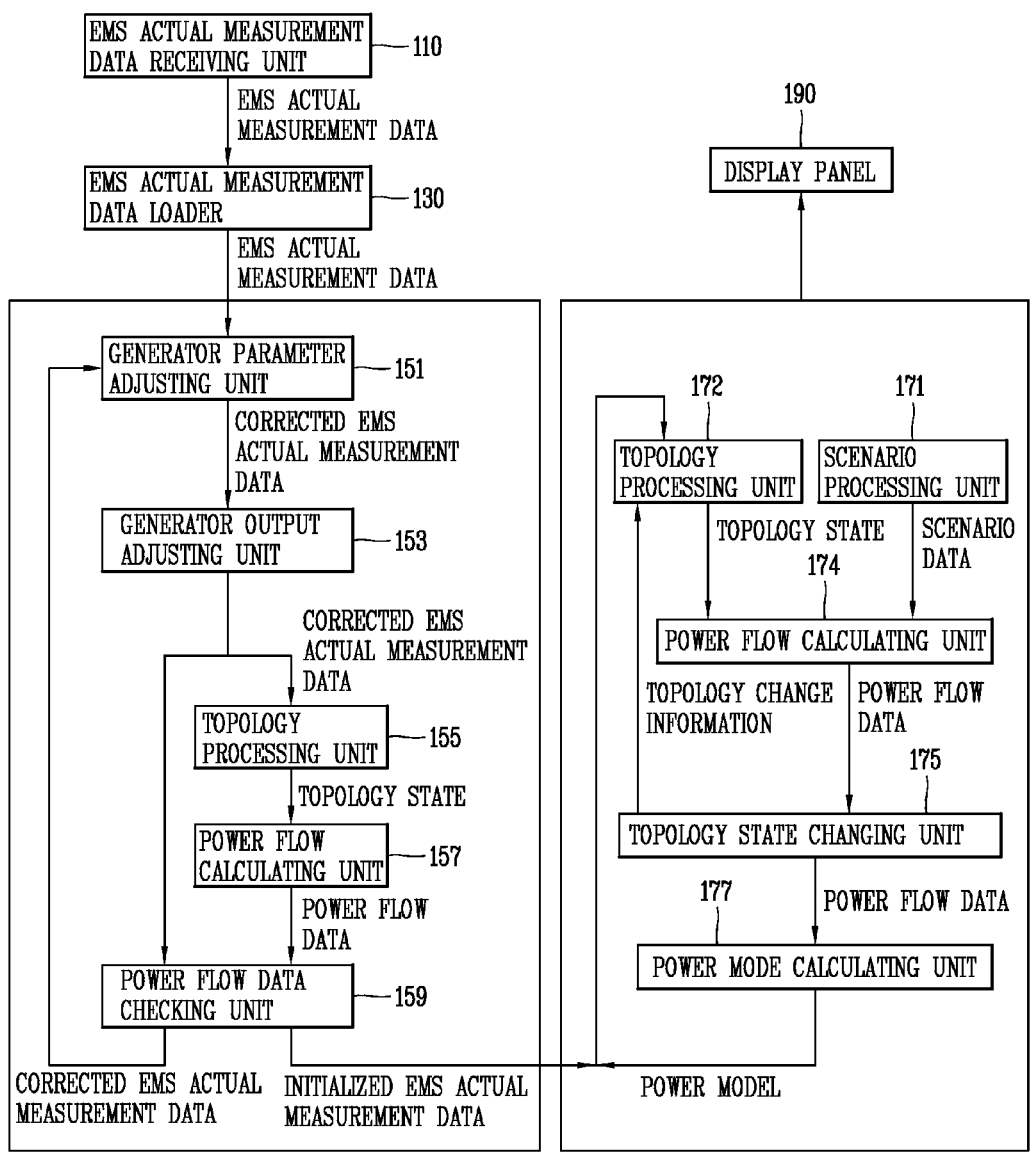
FIG. 1 is a block diagram of a dispatcher training simulating device according to an embodiment of the present invention.

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a mobile terminal related to the present invention will be described in detail with reference to the accompanying drawings. In the following description, usage of suffixes such as 'module', 'part' or 'unit' used for referring to elements is given merely to facilitate explanation of the present invention, without having any significant meaning by itself.

Hereinafter, a dispatcher training simulating device according to an embodiment of the present invention will be described with reference to FIGS. 1 and 2.

FIG. 1 is a block diagram of a dispatcher training simulating device according to an embodiment of the present invention.

As illustrated in FIG. 1, a dispatcher training simulating device 100 according to an embodiment of the present invention includes an energy management system (EMS) actual measurement data receiving unit 110, an EMS actual measurement loader 130, an EMS actual measurement data initializing unit 150, a dispatcher training simulation providing unit 170, and a display panel 190.

The EMS actual measurement data receiving unit 110 receives EMS actual measurement data from an EMS.

The EMS actual measurement data loader 130 loads EMS actual measurement data to the dispatcher training simulating device 100.

The EMS actual measurement data initializing unit 150 initializes the loaded EMS actual measurement data and outputs the initialized EMS actual measurement data.

The EMS actual measurement data initializing unit 150 includes a generator parameter adjusting unit 151, a generator output adjusting unit 153, a topology processing unit 155, a power flow calculating unit 157, and a power flow data checking unit 159.

The generator parameter adjusting unit 151 adjusts a generator parameter in the loaded EMS actual measurement data to correct the EMS actual measurement data.

The generator output adjusting unit 153 adjusts a generator output in consideration of a load value and power loss to correct the EMS actual measurement data, in order to resolve imbalance of power demand and supply in the loaded EMS actual measurement data.

The topology processing unit 155 analyzes the corrected EMS actual measurement data from the generator parameter adjusting unit 151 and the generator output adjusting unit 153, to check the current power transmission network topology state.

The power flow calculating unit 157 calculates power flow data based on the current power network topology state, the adjusted generator output, and the load value.

The power flow data checking unit 159 checks whether the calculated power flow data converges on a predetermined value.

The dispatcher training simulation providing unit 170 provides a dispatcher training simulation based on the initialized EMS actual measurement data from the EMS actual measurement data initializing unit 150.

The dispatcher training simulation providing unit 170 includes a scenario processing unit 171, a topology processing unit 172, a power flow calculating unit 174, a topology state changing unit 157, and a power model calculating unit 177.

The scenario processing unit 171 receives training scenario data from an operator.

The topology processing unit 172 analyzes the initialized EMS actual measurement data to check the current power transmission network topology state.

The power flow calculating unit 174 calculates power flow data based on the training scenario data, the current power transmission network topology state, the generator output, and the load value.

The topology state changing unit 175 changes the power transmission network topology state based on the calculated power flow data.

The topology state changing unit 175 checks whether the topology state has been changed.

The power model calculating unit 177 calculates a power model of a next step based on the calculated power flow data.

The components of the dispatcher training simulating device 100 of FIG. 1 will be described in detail with reference to FIG. 2.

FIG. 2 is a flow chart illustrating an operation of the dispatcher training simulating device according to an embodiment of the present invention.

The EMS actual measurement data receiving unit 110 receives EMS actual measurement data from an EMS (S110).

The EMS actual measurement data loader 130 loads the EMS actual measurement data to the dispatcher training simulating device 100 (S130).

The generator parameter adjusting unit 151 adjusts the generator parameter in the loaded EMS actual measurement data to correct the EMS actual measurement data (S151). The generator parameter adjusting unit 151 may adjust an upper limit value and a lower limit value of the generator output, as a generator parameter.

The generator output adjusting unit 153 adjusts the generator output in consideration of the load value and power loss to correct the EMS actual measurement data, in order to resolve demand and supply imbalance in the loaded EMS actual measurement data (S153).

The topology processing unit 155 analyzes the corrected EMS actual measurement data from the generator parameter adjusting unit 151 and the generator output adjusting unit 153, to check the current power transmission network topology state (S155).

The power flow calculating unit 157 calculates power flow data based on the current power network topology state, the adjusted generator output, and the load value (S157).

The power flow data checking unit 159 checks whether the calculated power flow data converges on a predetermined value. When the calculated power flow data converges on the predetermined value, the power flow data checking unit 159 provides the current corrected EMS actual measurement data as initialized EMS actual measurement data to the dispatcher training simulation providing unit 150 (S159), and when the calculated power flow data is diverged, the power flow data checking unit 159 output the current corrected EMS actual measurement data to the generator output adjusting unit 153.

The scenario processing unit 171 receives training scenario data from an operator (S171). In this case, the training scenario data may include one or more training events, a time for the one or more training events, and a condition for the one or more training event. The training event may include a change in the generator output, a change in the load, and the like.

The topology processing unit 172 analyzes the initialized EMS actual measurement data to check the current power transmission network topology state (S172).

The power flow calculating unit 174 calculates power flow data based on the training scenario data, the current power transmission network topology state, the generator output, and the load value (S174).

The topology state changing unit 175 changes the power transmission network topology state based on the calculated power flow data (S175). In this case, the topology state changing unit 155 determines a relay state change condition and a transformer tap state change condition based on the calculated power flow data, and when the relay state change condition is met, the topology state changing unit 175 changes a state of a relay, and when the transformer tap state change condition is met, the topology state changing unit 175 changes a state of a transformer tap.

The topology state changing unit 175 checks whether the topology state has been changed (S176). When the topology state has been changed, the topology state changing unit 175 outputs topology state change information to the topology processing unit 172. When the topology state has not been changed, the topology state changing unit 175 outputs the calculated power flow data to the power model calculating unit 177.

The power model calculating unit 177 calculates a power model at a next step based on the calculated power flow data (S177). The power model of the next step may include a load value of the next step, a generator output at the next step, a power transmission network model of the next step. The power transmission network model of the next step may include next data regarding power transmission facilities.

In the embodiments of the present invention, the foregoing method may be implemented as codes that can be read by a processor in a program-recorded medium. The processor-readable medium may include, for example, a ROM, a RAM, a CD-ROM, a magnetic tape, a floppy disk, an optical data storage device, and the like. The processor-readable medium also includes implementations in the form of carrier waves (e.g., transmission via the Internet).

The configuration and method according to the embodiments of the present disclosure described above are not limited in its application, but the entirety or a portion of the embodiments can be selectively combined to be configured into various modifications.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A dispatcher training simulating device comprising:
an energy management system (EMS) actual measurement data loader configured to load EMS actual measurement data to the dispatcher training simulating device;
an EMS actual measurement data initializing unit configured to calculate a power flow by adjusting a generator output in the loaded EMS actual measurement data, and generate initialized EMS actual measurement data based on whether the calculated power flow converges on a predetermined value; and
a dispatcher training simulation providing unit configured to provide a dispatcher training simulation based on the initialized EMS actual measurement data,
wherein the EMS actual measurement data initializing unit comprises:
a generator output adjusting unit configured to adjust the generator output to correct the loaded EMS actual measurement data;
a topology processing unit configured to analyze the corrected EMS actual measurement data to check the current power transmission network topology state;
a power flow calculating unit configured to calculate power flow data based on the current power transmission network topology state and the adjusted generator output; and
a power flow data checking unit configured to generate the corrected EMS actual measurement data corresponding to converged power flow data, as the initialized EMS actual measurement data.

2. The dispatcher training simulating device of claim 1, wherein the EMS actual measurement data initializing unit further comprises:
a generator parameter adjusting unit configured to adjust a generator parameter in the loaded EMS actual measurement data to correct the loaded EMS actual measurement data.

3. The dispatcher training simulating device of claim 2, wherein the generator parameter includes an upper limit value and a lower limit value of the generator output.

4. The dispatcher training simulating device of claim 1, wherein the generator output adjusting unit adjusts the generator output in consideration of a load value and power loss.

5. The dispatcher training simulating device of claim 1, wherein the power flow calculating unit calculates power flow data based on the current power transmission network topology state, the adjusted generator output, and the load value.

6. The dispatcher training simulating device of claim 2, wherein the generator output adjusting unit adjusts the generator output in consideration of a load value and power loss.

7. The dispatcher training simulating device of claim 2, wherein the power flow calculating unit calculates power flow data based on the current power transmission network topology state, the adjusted generator output, and the load value.

8. The dispatcher training simulating device of claim 3, wherein the generator output adjusting unit adjusts the generator output in consideration of a load value and power loss.

9. The dispatcher training simulating device of claim 3, wherein the power flow calculating unit calculates power flow data based on the current power transmission network topology state, the adjusted generator output, and the load value.

10. The dispatcher training simulating device of claim 1, wherein the dispatcher training simulation providing unit comprises:

a scenario processing unit configured to receive training scenario data from an operator;

a topology processing unit configured to analyze the initialized EMS actual measurement data to check the current power transmission network topology state;

a power flow calculating unit configured to calculate power flow data based on the training scenario data, the current power transmission network topology state, the generator output, and the load value; and a power model calculating unit configured to calculate a next power model based on the power flow data.

11. The dispatcher training simulating device of claim 10, further comprising:

a topology state changing unit configured to change the power transmission network topology state based on the power flow data, wherein when the topology state is not changed, the power model calculating unit calculates a next power model based on the power flow data.

* * * * *